United States Patent
Nam et al.

(10) Patent No.: US 11,257,549 B2
(45) Date of Patent: Feb. 22, 2022

(54) SEQUENTIAL VOLTAGE CONTROL FOR A MEMORY DEVICE

(71) Applicant: Micron Technology, Inc., Boise, ID (US)

(72) Inventors: Ki-Jun Nam, Boise, ID (US); Takamasa Suzuki, Tokyo (JP); Yantao Ma, Boise, ID (US); Yasushi Matsubara, Isehara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/870,670

(22) Filed: May 8, 2020

(65) Prior Publication Data

US 2021/0350861 A1 Nov. 11, 2021

(51) Int. Cl.
*G11C 5/14* (2006.01)
*G11C 11/4074* (2006.01)
*G11C 11/417* (2006.01)
*G11C 16/30* (2006.01)
*G11C 16/12* (2006.01)
*G11C 7/20* (2006.01)
*G11C 16/04* (2006.01)
*G11C 16/32* (2006.01)

(52) U.S. Cl.
CPC ............. *G11C 16/30* (2013.01); *G11C 5/144* (2013.01); *G11C 5/147* (2013.01); *G11C 7/20* (2013.01); *G11C 11/4074* (2013.01); *G11C 11/417* (2013.01); *G11C 16/045* (2013.01); *G11C 16/12* (2013.01); *G11C 16/32* (2013.01)

(58) Field of Classification Search
CPC ....... G11C 16/045; G11C 16/12; G11C 16/30; G11C 16/32; G11C 7/20; G11C 5/144; G11C 5/147; G11C 11/4074; G11C 11/417
USPC .................................................. 365/226, 227
See application file for complete search history.

(56) References Cited

U.S. PATENT DOCUMENTS

| | | | | |
|---|---|---|---|---|
| 6,510,096 B2* | 1/2003 | Choi | ...................... | G11C 5/143 365/226 |
| 6,683,491 B2* | 1/2004 | Koga | .................. | G11C 11/4074 327/538 |
| 10,216,242 B2* | 2/2019 | Tran | ........................ | G11C 7/20 |
| 2004/0143769 A1* | 7/2004 | Deng | ....................... | G11C 7/22 713/300 |

* cited by examiner

*Primary Examiner* — Son L Mai
(74) *Attorney, Agent, or Firm* — Holland & Hart LLP

(57) ABSTRACT

Methods, systems, and devices for sequential voltage control for a memory device are described. A memory device may have various voltage sources that support different voltage levels used in various operations of the memory device. Voltage sources of a memory device may be disabled under some circumstances, such as when the memory device is idled, or operated in a low-power or powered-down mode, among other circumstances. In accordance with examples as disclosed herein, voltage sources of a memory device or memory die may be sequentially enabled or sequentially disabled. For example, voltage sources may be enabled in an order from voltage sources having relatively higher nominal voltages to voltage sources having relatively lower voltages, or disabled in an order from voltage sources having relatively lower nominal voltages to voltage sources having relatively higher voltages.

22 Claims, 8 Drawing Sheets

US 11,257,549 B2

SEQUENTIAL VOLTAGE CONTROL FOR A MEMORY DEVICE

BACKGROUND

The following relates generally to one or more memory systems and more specifically to sequential voltage control for a memory device.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
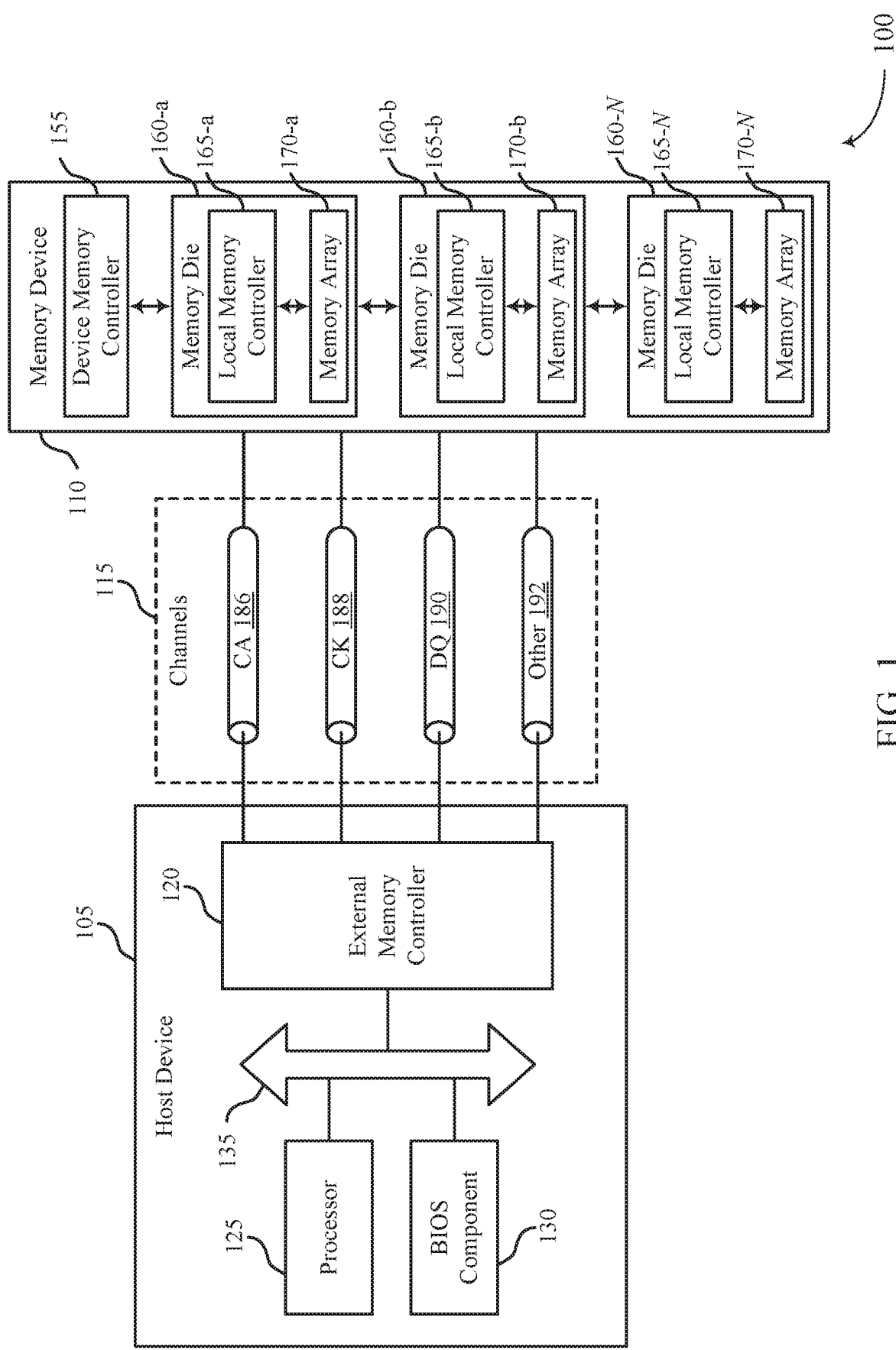
FIG. 1 illustrates an example of a system that supports sequential voltage control for a memory device in accordance with examples as disclosed herein.

Memory devices may include various configurations of voltage sources for performing operations of the memory device. In some examples, voltage sources of a memory device, or a memory die of a memory device, may be coupled with a voltage supply pin of the memory device or memory die, which may be coupled with an external power source (e.g., of a host device, of an external power supply). A voltage source of a memory device or memory die may be internal to the device or die and may provide a regulated voltage that is different than (e.g., higher than, lower than, filtered or regulated differently than) a voltage of the voltage supply pin. A memory device, a memory die, or a combination thereof may have different voltage sources to support different voltage levels used in various operations.

Voltage sources of a memory device may be disabled under some circumstances, such as when the memory device is idled, or operated in a low-power or powered down mode, among other circumstances. In some cases of disabling voltage sources, a voltage source or related voltage bus or component may normally be at a relatively high voltage, but may have a voltage level pulled down before or concurrently with a voltage source or related voltage bus or component that is normally at a relatively lower voltage. In some examples, an inversion of relative voltages between voltage buses or coupled components may result in adverse semiconductor behavior, undue power consumption, data integrity issues, or other adverse behavior.

In accordance with examples as disclosed herein, voltage sources of a memory device or memory die may be sequentially enabled or sequentially disabled, such as according to an order of relative voltage levels. For example, voltage sources may be enabled in an order from voltage sources having relatively higher nominal voltages to voltage sources having relatively lower voltages, or disabled in an order from voltage sources having relatively lower nominal voltages to voltage sources having relatively higher voltages. By implementing such techniques, relative biasing between components of a memory device or a memory die may be maintained (e.g., certain components being maintained at a relatively higher voltage than certain neighboring components, certain components being maintained at a relatively lower voltage than certain neighboring components), which may improve operation of the memory device or the memory die compared to configurations that do not implement such sequential enabling or disabling.

Features of the disclosure are initially described in the context of memory systems and dies as described with reference to FIGS. 1 and 2. Features of the disclosure are described in the context of memory device circuitry and voltage control operations as described with reference to FIGS. 3 through 6. These and other features of the disclosure are further illustrated by and described with reference to an apparatus diagram and flowcharts that relate to sequential voltage control for a memory device as described with reference to FIGS. 7 and 8.

FIG. 1 illustrates an example of a system 100 that supports sequential voltage control for a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

The memory device 110 may include various configurations of voltage sources for performing operations of the memory device 110. In some examples, voltage sources of a memory device 110 (e.g., of a device memory controller 155), or a memory die 160 of a memory device 110 (e.g., of a local memory controller 165), may be coupled with a voltage supply pin of the memory device 110 or memory die 160. A voltage supply pin of a memory device 110 or memory die 160 may be coupled with an external power source, such as a power supply or voltage regulator of the host device 105 (e.g., via a corresponding voltage supply pin of the host device 105) or otherwise included in the system 100. A voltage source of a memory device 110 or memory die 160 may provide power to various components by way of a regulated voltage that is different than (e.g., higher than, lower than, filtered or regulated differently than) a voltage of the voltage supply pin or terminal. A memory device 110, or a memory die 160, or a combination thereof, may have different voltage sources to support different voltage levels used in various operations. Voltage sources of a memory device 110 or memory die 160 may be disabled under some circumstances, such as when the memory device is idled, or operated in a low-power or powered down mode, among other circumstances. In some examples, voltage sources may be disabled in response to a command (e.g., from the host device 105 via a CA channel, from a device memory controller 155), such as a power-down command, or a power-down mode initiated at the memory device 110, or based on a signal state of at a pin or other signaling component of the memory device 110 or memory die 160.

In accordance with examples as disclosed herein, voltage sources of a memory device 110 or memory die 160 may be sequentially enabled or sequentially disabled according to an order of relative voltage levels. For example, voltage sources may be enabled in an order from voltage sources having relatively higher nominal voltages to voltage sources having relatively lower voltages, or disabled in an order from voltage sources having relatively lower nominal voltages to voltage sources having relatively higher voltages. By implementing such techniques, relative biasing between components of the memory device 110 or memory die 160 may be maintained (e.g., certain components being maintained at a relatively higher voltage than certain neighboring components, certain components being maintained at a relatively lower voltage than certain neighboring components), which may improve operation of the memory device 110 or the memory die 160 compared to configurations that do not implement such sequential enabling or disabling.

Figure 2:
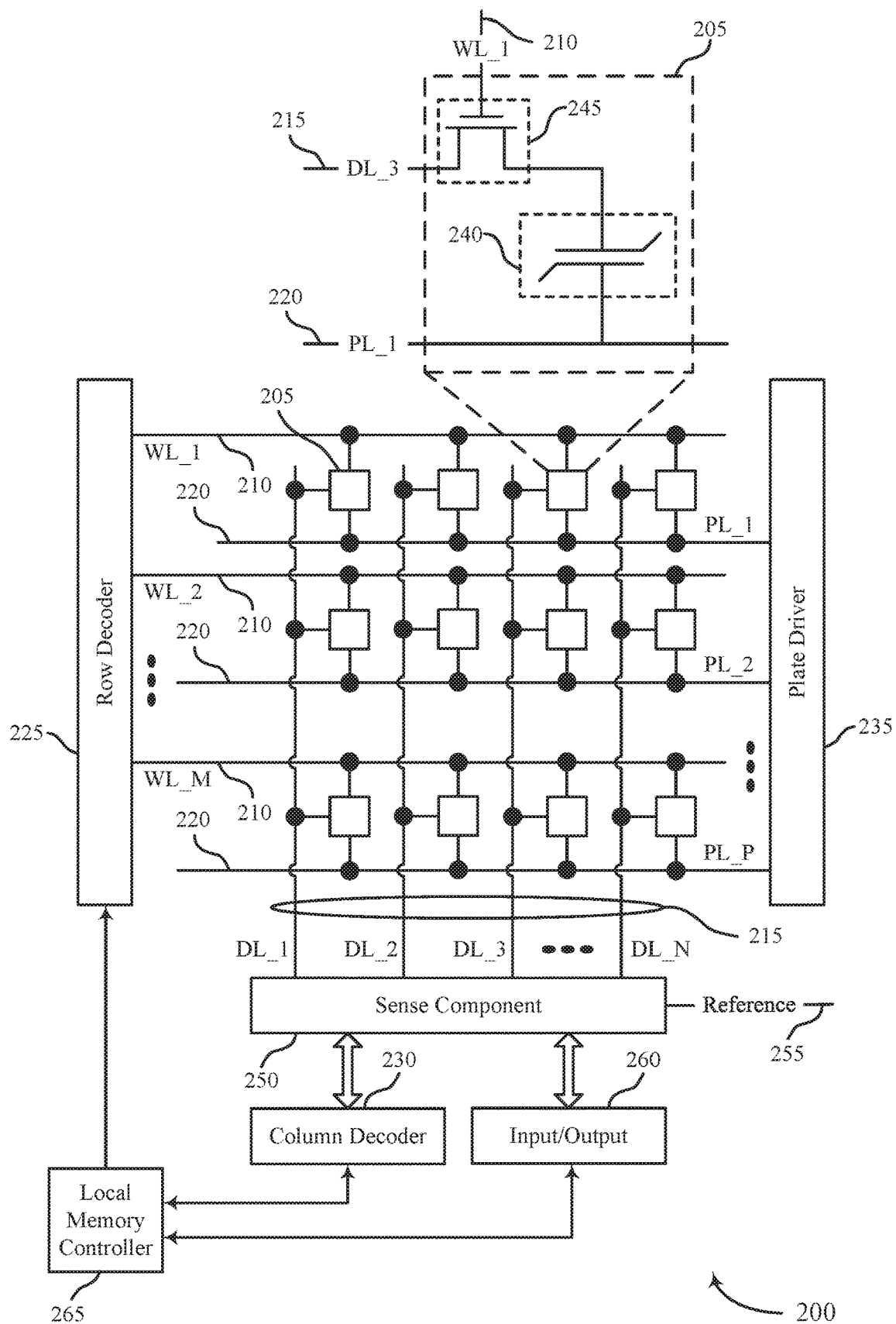
FIG. 2 illustrates an example of a memory die that supports sequential voltage control for a memory device in accordance with examples as disclosed herein.

FIG. 2 illustrates an example of a memory die 200 that supports sequential voltage control for a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with or included in the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The memory die 200 (e.g., the local memory controller 265) may include various configurations of voltage sources for performing operations of the memory die 200. In some examples, voltage sources of the memory die 200 may be coupled with a voltage supply pin of the memory die 200, which may be coupled with an external power source (e.g., a power supply of a host device 105, a power supply of a memory device 110 that includes the memory die 200). A voltage source of the memory die 200 may provide a regulated voltage that is different than a voltage of the voltage supply pin, and the memory die 200 may include different voltage sources to support different voltage levels used in various operations.

Voltage sources of a memory device may be disabled under some circumstances, such as when the memory die 200 is idled, or operated in a low-power or powered down mode, among other circumstances. In accordance with examples as disclosed herein, voltage sources of the memory die 200 may be sequentially enabled or sequentially disabled according to an order of relative voltage levels. For example, voltage sources may be enabled in an order from voltage sources having relatively higher nominal voltages to voltage sources having relatively lower voltages, or disabled in an order from voltage sources having relatively lower nominal voltages to voltage sources having relatively higher voltages. By implementing such techniques, relative biasing between components of the memory die 200 may be maintained. For example, certain components of the memory die 200 may be maintained at a relatively higher voltage than certain neighboring components, or certain components of the memory die 200 may be maintained at a relatively lower voltage than certain neighboring components, which may support favorable operation of the memory die 200.

Figure 3:
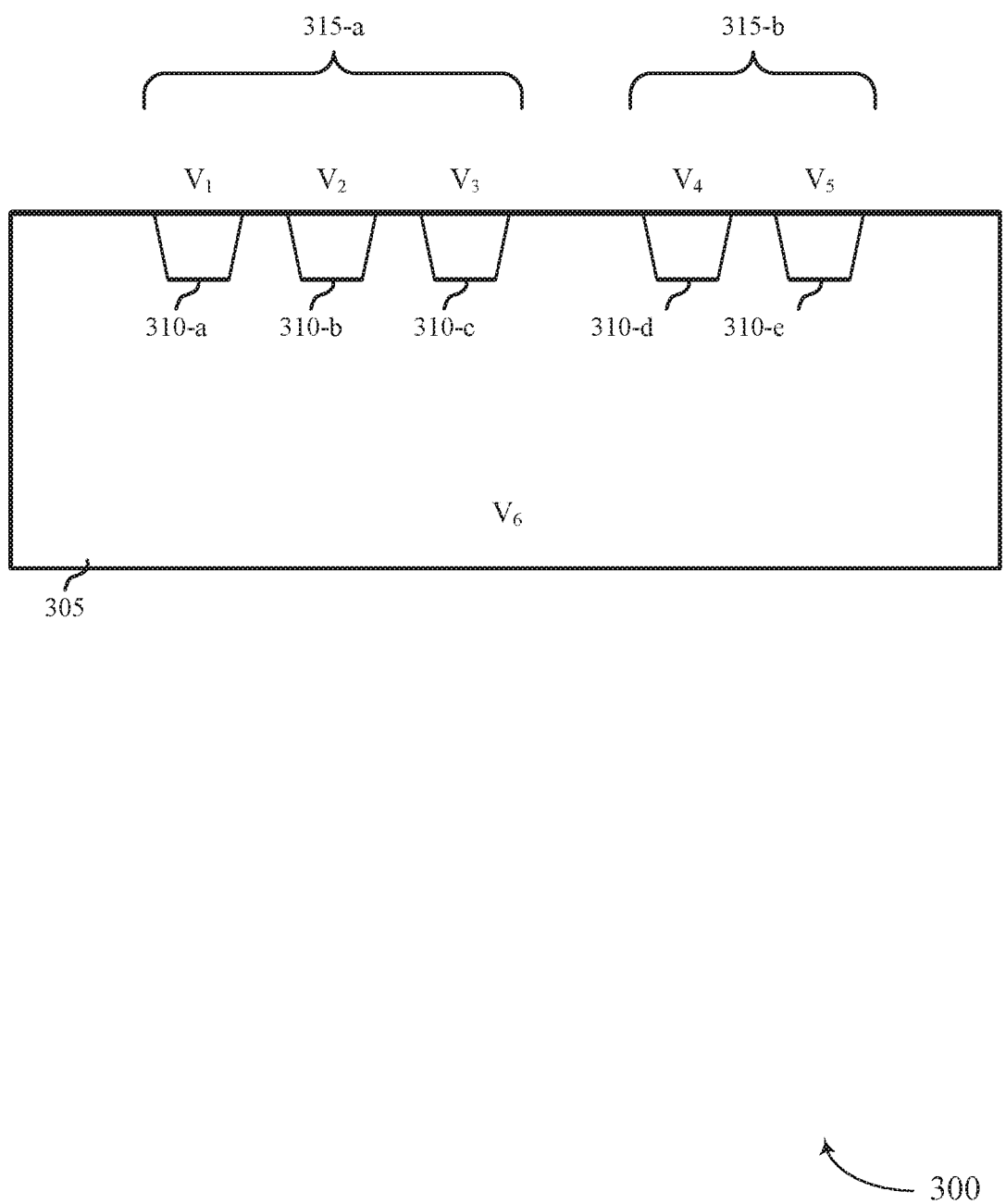
FIG. 3 illustrates an example of an array core that supports sequential voltage control for a memory device in accordance with examples as disclosed herein.

FIG. 3 illustrates an example of an array core 300 that supports sequential voltage control for a memory device in accordance with examples as disclosed herein. The array core 300 illustrates a simplified cross-sectional layout that includes a substrate 305 and a set of junctions 310. In some examples, the array core 300 may be a component of a memory die 200, or some portion thereof (e.g., of a local memory controller 265, of a memory array 170).

In some examples, the substrate 305 may be biased by one voltage, and different internal voltages may be input to the array core 300 via the junctions 310. For example, each of the junctions 310 may be associated with a respective voltage level (e.g., one of voltages $V_1$ through $V_5$), and may be configured to be coupled with respective voltage sources configured to provide a regulated or nominal voltage level or voltage setting for a respective junction 310 under normal or powered-up conditions (e.g., $V_{1,nom}$ through $V_{5,nom}$). Each of the regulated or nominal voltage levels may be associated with performing various operations of a memory die 200, such as accessing memory cells 205 or performing various logical operations that may or may not be related to accessing memory cells 205 (e.g., memory management operations, error handling operations, wear-leveling operations). In some examples, the regulated or nominal voltages may be provided to components of the memory die 200 to support such operations as conveying timing, logical, or control signaling, activating access lines (e.g., selecting or biasing word lines 210, digit lines 215, or plate lines 220), charging or boosting signal development components such as amplification capacitors or charge transfer sensing amplifiers, biasing signal development voltage regulation amplifiers (e.g., cascodes), latching signal comparisons at sense amplifiers (e.g., of a sense component 250), latching or conveying information via an input/output component 260, or other operations that may support reading, writing, or processing information of a memory cell 205.

The substrate 305 may be associated with a voltage level (e.g., $V_6$), and may be configured to be coupled with a voltage source configured to provide a regulated or nominal voltage level or voltage setting for the substrate 305 under normal or powered-up conditions (e.g., $V_6$). In some examples, the substrate 305 may operate as or be otherwise illustrative of a well of a semiconductor arrangement of the array core 300, such as a semiconductor n-well. Each of the junctions 310 may operate as or be otherwise illustrative of a junction, such as a semiconductor p+ junction. Thus, each of the junctions 310, or a combination of the substrate 305 and a respective junction 310, may operate as or be otherwise illustrative of a semiconductor diode configuration.

Under normal operating conditions, the substrate 305 may be biased with a nominal or regulated voltage, $V_{6,nom}$, which may be a common collector voltage (e.g., VCCP) that is higher than each of $V_{1,nom}$ through $V_{5,nom}$. In such a configuration, each of the junctions 310 may be configured to block current flow from the substrate 305 to a respective signal path or voltage source bus. In the example of array core 300, various operations may be configured to use one of the six voltage levels $V_{1,nom}$ through $V_{6,nom}$, but an array core in accordance with the described techniques may involve any quantity of junctions 310, or any quantity of voltage levels, and it is to understood that this any other specific numeric example herein is provided solely for illustrative clarity and is not limiting of the claims.

In a power-down operation, each of the voltage sources coupled with the substrate 305 and the junctions 310 may be disabled, which may correspond to a voltage pull-down operation that reduces the voltages applied to the substrate 305 and respective junctions 310 (e.g., a pull down from the voltages $V_{1,nom}$ through $V_{6,nom}$). If a voltage source associated with the substrate 305 is disabled too early (e.g., before disabling voltage sources associated with the junctions 310), a voltage of the substrate 305 may fall below a voltage of one or more of the junctions 310, such that current may flow through the respective junction 310. Such a condition may be referred to as a forward biasing current, which may be associated with adverse behavior of a memory die such as latch-up phenomena, unnecessary power consumption (e.g., leakage), data integrity issues, or others. Thus, in the illustrative example, it may be beneficial to initiate power-down operations such that a voltage of the substrate 305 remains above a voltage of any one or more of the junctions 310, among other voltage relationships.

In accordance with examples as disclosed herein, voltage sources of a memory die 200 (e.g., associated with biasing the substrate 305 and junctions 310 of the array core 300) may be sequentially enabled or sequentially disabled according to an order of relative voltage levels of the voltage sources. For example, voltage sources may be disabled in an order from voltage sources having relatively lower nominal voltages (e.g., voltage sources associated with biasing the junctions 310-a through 310-e) to voltage sources having relatively higher voltages (e.g., a voltage source associated with biasing the substrate 305). By implementing such techniques, relative biasing between components of the memory die 200 may be maintained, including maintaining the substrate 305 (e.g., an n-well) at a relatively higher voltage than the junctions 310 (e.g., p+ junctions).

In some examples, voltage sources may be grouped, and grouped voltage sources may be disabled or enabled according to such a grouping. For example, the voltage sources associated with biasing the junctions 310-a through 310-c may be part of a first group 315-a, and the voltage sources associated with biasing the junctions 310-d and 310-e may be part of a second group 315-b. In some examples, each of the voltages $V_1$ through $V_3$ may be lower than each of the voltages $V_4$ and $V_5$, such that the first group 315-a is a relatively lower-voltage group and the second group 315-b is a relatively higher voltage group. In some examples, such grouping may correspond to which of a set of external power supply voltages is providing power to the respective voltage sources of a group 315. For example, voltage sources of the first group 315-a may be supplied by a first external supply having a first supply voltage, and voltage sources of the second group 315-b may be supplied by a second external supply having a second supply voltage that is greater than the first supply voltage. A voltage source associated with biasing the substrate 305 may be included in or otherwise referred to as another, third voltage group that is associated with a relatively higher voltage than each of the first group 315-a and the second group 315-b. To maintain voltage separation, the disabling or enabling of each of the voltage sources associated with the first group 315-a may be initiated concurrently, the disabling or enabling of each of the voltage sources associated with the second group 315-b may be initiated concurrently and at a different time than the first group 315-a, and the disabling or enabling of a voltage source associated with biasing the substrate 305 may be initiated at a different time than the first group 315-a and the second group 315-b.

Figure 4:
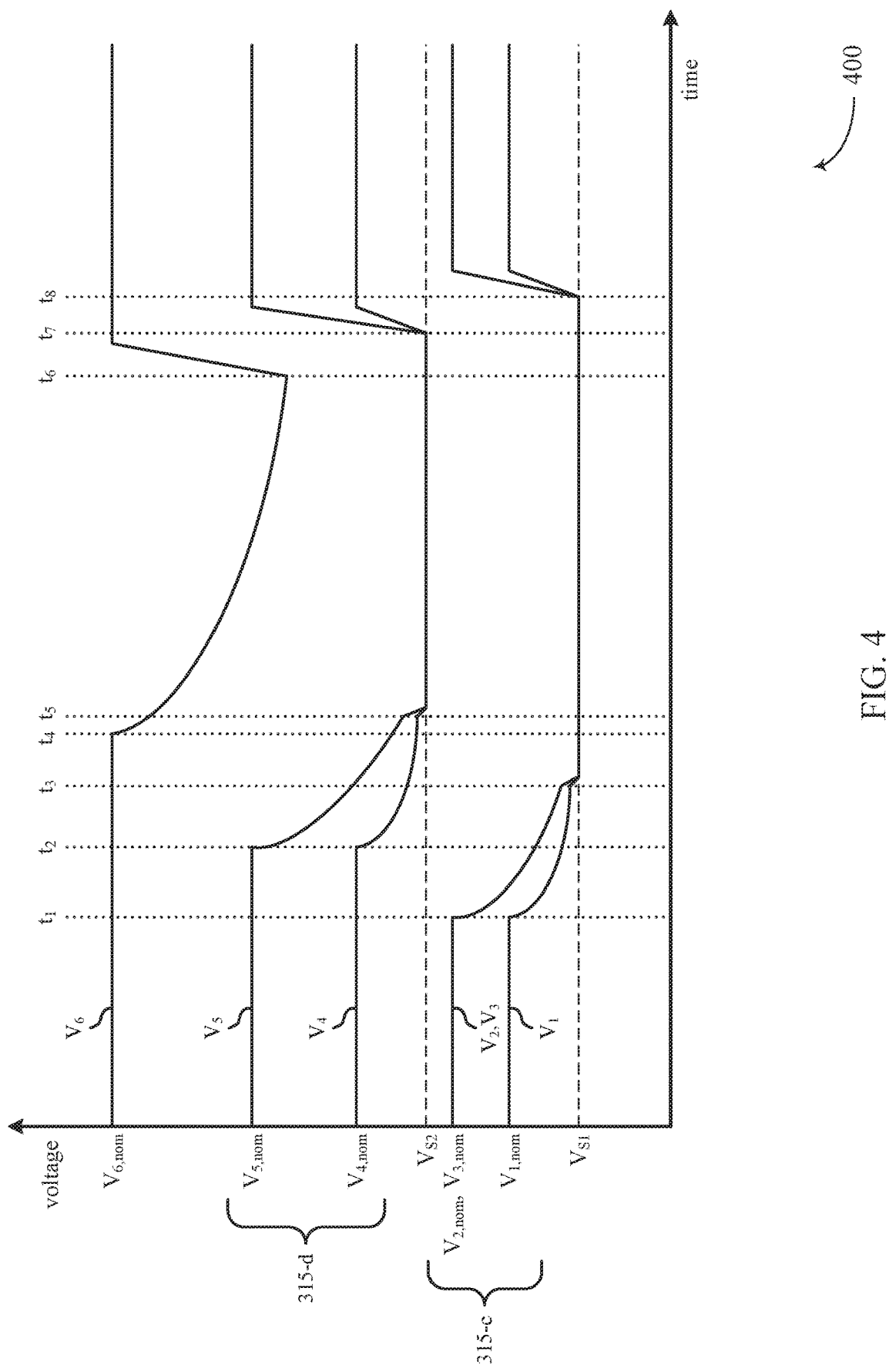
FIG. 4 illustrates an example of a timing diagram that supports sequential voltage control for a memory device in accordance with examples as disclosed herein.

FIG. 4 illustrates an example of a timing diagram 400 that supports sequential voltage control for a memory device in accordance with examples as disclosed herein. The timing diagram illustrates an example of sequential disabling and enabling of voltage sources that may be associated with six nodes (e.g., voltage source buses), components, or operations of a memory die 200 (e.g., each associated with a respective one of voltages $V_1$ through $V_6$). In one example, the voltages of the timing diagram 400 may be associated with the substrate 305 and junctions 310 described with reference to FIG. 3. However, the described techniques are applicable to other components, configurations, and quantities of voltage sources of a memory die 200.

The example of timing diagram 400 illustrates an example of disabling and enabling six voltage sources, each configured to provide a respective regulated of nominated voltage level (e.g., one of $V_{1,nom}$ through $V_{6,nom}$). Certain voltage sources may be grouped, including voltage sources associated with voltages $V_{1,nom}$, $V_{2,nom}$, and $V_{3,nom}$ being grouped in a first group 315-c, and voltage sources associated with voltages $V_{4,nom}$ and $V_{5,nom}$ being grouped in a second group 315-d. In some examples, each voltage source of a group 315 may be associated with a common external voltage supply (e.g., of a host device 105, of a memory device 110). For example, each of the voltage sources of the first group 315-c may be powered by or otherwise configured to be coupled with a first external voltage supply having a nominal voltage of $V_{S1}$, and each of the voltage sources of the second group 315-d may be powered by or otherwise configured to be coupled with a second external voltage supply having a nominal voltage $V_{S2}$. Although each of the nominal voltage levels of a group 315 are shown as being higher than an associated supply voltage, in various examples, any quantity of one, more than one, or all of the regulated voltage levels in a group 315 may be below an associated supply voltage.

The timing diagram 400 may begin in a powered-up or operational state of a memory die 200, in which each of the voltage sources associated with the illustrated voltages (e.g., $V_1$ through $V_6$) are powered-up (e.g., to a regulated or nominal voltage of one of $V_{1,nom}$ through $V_{6,nom}$). The memory die 200 may identify a power-down condition based on a command (e.g., a power-down command, an enter power down command, an idle command, a sleep command, a deep sleep command, an exit active command, an exit power-up command), a pin state (e.g., a RESET pin state), or other indication or determination, and initiate a power-down operation based on the identified condition, which may begin at $t_1$.

At $t_1$, the memory die 200 may disable voltage sources of the first group 315-c (e.g., a relatively low voltage group), which may be associated with a voltage pull-down of the respective voltage sources. Accordingly, each of the voltages associated with the first group 315-c (e.g., voltages $V_1$, $V_2$, and $V_3$) may drop. The voltages corresponding the first group 315-c may drop in response to charge being transferred through respective bleed or sink circuits, or some other leakage charge or current, which may, in some examples, be configured according to a desired slew rate or time constant of voltage decay (e.g., a time constant that is common to signal paths or circuitry associated with the first group 315-c). In some examples, the operations at $t_1$ may be performed immediately upon identifying a power-down condition, or may be delayed by some duration (e.g., initiated upon a subsequent transition of a synchronized clock signal or other timing signal).

At $t_2$, the memory die 200 may disable voltage sources of the second group 315-d (e.g., a middle voltage group), which may be associated with a voltage pull-down of the respective voltage sources. Accordingly, each of the voltages associated with the second group 315-d (e.g., voltages $V_4$ and $V_5$) may drop. The voltages corresponding to the second group 315-d may drop in response to charge being transferred through respective bleed or sink circuits, or some other leakage charge or current, which may be configured according to a same or different slew rate or time constant of voltage decay as those of the first group 315-c (e.g., a time constant that is common to signal paths or circuitry associated with the second group 315-d, which may or may not be the same time constant as the first group 315-c).

In some examples, a duration between $t_2$ and $t_1$ (e.g., a first delay duration) may be configured to support a level or proportion of voltage decay of the first group 315-c, where such a delay may be implemented by way of a counter of the memory die 200. Imposing such a delay may be one technique employed to support voltages of the second group 315-d remaining above those of the first group 315-c. Additionally or alternatively, a voltage clamping may be employed on the first group 315-c to support those voltages remaining below those of the second group 315-d. For example, at $t_3$, the memory die 200 may initiate a clamping operation on the first group 315-c, which may include coupling nodes or components (e.g., a voltage source bus, a bleed or sink circuit) with an external voltage supply (e.g., having a voltage $V_{S1}$) or some other clamping voltage source, pulling the voltages $V_1$, $V_2$, and $V_3$ to the clamping voltage level. Although the operations of $t_3$ are illustrated as being initiated after the operations of $t_2$, in various examples, clamping of the first group 315-c may be initiated before or after the disabling of voltage sources of the second group 315-d, or omitted. Thus, in accordance with various examples of the described techniques, a relative voltage relationship between the second group 315-d and the first group 315-c may be maintained by way of the sequential disabling of the second group 315-d following the disabling of the first group 315-c (e.g., certain signal paths, nodes, or voltage source buses associated with the second group 315-d having voltages that remain higher than voltages of signal paths, nodes, or voltage source buses associated with the first group 315-c).

At $t_4$, the memory die 200 may disable a voltage source associated with the voltage $V_6$ (e.g., a high voltage source or voltage source group), which may be associated with a voltage pull-down of the respective voltage source. Accordingly, the voltage $V_6$ may drop, which may be related to charge being transferred through a bleed or sink circuit, or some other leakage charge or current, which may be configured according to a same or different slew rate or time constant of voltage decay as those of the first group 315-c or the second group 315-d.

In some examples, a duration between $t_4$ and $t_2$ (e.g., a second delay duration) may be configured to support a level or proportion of voltage decay of the second group 315-d, where such a delay may be implemented by way of another counter of the memory die 200. Imposing such a delay may be one technique employed to support the voltage $V_6$ remaining above those of the second group 325-c. Additionally or alternatively, a voltage clamping may be employed on the second group 315-d to support those voltages remaining below $V_6$. For example, at $t_5$, the memory die 200 may initiate a clamping operation on the second group 315-d, which may include coupling nodes or components (e.g., a voltage source bus, a bleed or sink circuit) with an external voltage supply (e.g., having a voltage $V_{S2}$) or some other clamping voltage source, pulling the voltages $V_4$ and $V_5$ to the clamping voltage level. Although the operations of $t_5$ are illustrated as being initiated after the operations of $t_4$, in various examples, clamping of the second group 315-d may be initiated before or after disabling a voltage source associated with the voltage $V_6$, or omitted. Thus, in accordance with various examples of the described techniques, a relative voltage relationship may be maintained by way of the sequential disabling of the voltage source associated with the voltage $V_6$ following the disabling of the second group 315-d.

Following the operations of $t_5$, or some amount of settling time after $t_5$, the voltage sources associated with the timing diagram 400 may be in a fully powered-down condition or mode. In some examples, a voltage source or related nodes or voltage source buses associated with the voltage $V_6$ may be in a floating condition, where a level of voltage $V_6$ may be indeterminate. Such conditions may support a powering-up to occur relatively quickly, or involving relatively less charge transfer. However, in some cases a floating condition or indeterminate voltage level may be associated with operational uncertainty or adverse behavior. Thus, in some examples, after $t_5$, the memory die 200 may initiate a clamping operation corresponding to the voltage $V_6$, which may include coupling nodes or components (e.g., a voltage source bus, a bleed or sink circuit) with an external voltage supply or some other clamping voltage source). For example, a node or voltage source bus may be coupled with the external supply associated with the voltage level $V_{S2}$ (e.g., an external supply the may or may not be configured to provide power to the respective voltage source).

While in a powered-down condition, or at some intermediate time during the powering down of respective voltage sources, the memory die 200 may identify a power-up condition based on a command (e.g., a power-up command, a recover command, an exit power-down command, an exit idle command, an exit sleep command, an enter active command, an enter power-up command), a pin state (e.g., a RESET pin state), or other indication or determination, and initiate a power-up operation based on the identified condition, which may begin at $t_6$.

At $t_6$, the memory die 200 may enable a voltage source associated with the voltage $V_6$ (e.g., a high voltage source or voltage source group), which may be associated with a voltage pull-up of the respective voltage source. Accordingly, the voltage $V_6$ may rise to the nominal or regulated voltage, which may be related to charge being transferred from an external supply or charging a corresponding bleed or sink circuit. In some examples, the operations at $t_6$ may be performed immediately upon identifying a power-up condition, or may be delayed by some duration (e.g., initiated upon a subsequent transition of a synchronized clock signal or other timing signal).

At $t_7$, the memory die 200 may enable voltage sources of the second group 315-d (e.g., a middle voltage group), which may be associated with a voltage pull-up of the respective voltage sources. Accordingly, each of the voltages associated with the second group 315-d (e.g., voltages $V_4$ and $V_5$) may rise to their nominal or regulated voltages. In some examples, a duration between $t_6$ and $t_7$ (e.g., a third delay duration) may be configured to support a level or proportion of voltage rise of the voltage $V_6$, where such a delay may be implemented by way of another counter of the memory die 200. Imposing such a delay may be one technique to support voltage $V_6$ remaining above those of the of the second group 315-d. Thus, in accordance with various examples of the described techniques, a relative voltage relationship between $V_6$ and those of the second group 315-d may be maintained by way of the sequential enabling of the second group 315-d after the enabling of the voltage source associated with $V_6$.

At $t_5$, the memory die 200 may enable voltage sources of the first group 315-c (e.g., a low voltage group), which may be associated with a voltage pull-up of the respective voltage sources. Accordingly, each of the voltages associated with the first group 315-c (e.g., voltages $V_1$, $V_2$, and $V_3$) may rise to their nominal or regulated voltages. In some examples, a duration between $t_7$ and $t_5$ (e.g., a fourth delay duration) may be configured to support a level or proportion of voltage rise of the voltages of the second group 315-d, where such a delay may be implemented by way of another counter of the memory die 200. Imposing such a delay may be one technique to support voltages of the second group 315-d remaining above those of the of the first group 315-c. Thus, in accordance with various examples of the described techniques, a relative voltage relationship between voltages of the second group 315-d and those of the first group 315-c may be maintained by way of the sequential enabling of the first group 315-c after the enabling of the second group 315-d.

Although the timing diagram 400 illustrates an example where the voltage source associated with the voltage $V_6$ is disabled, in some examples, a power-up condition may be identified before the voltage source associated with the voltage $V_6$ is disabled. In such cases, the memory die 200 may abort aspects of a power-down operation, and proceed directly to remaining power-up operations. For example, if a power-up command or other indication is issued between $t_2$ and $t_4$ (e.g., where the voltage source associated with the voltage $V_6$ is enabled), the memory die 200 may proceed directly with the operations of $t_7$ to enable voltage sources of the second group 315-d, followed by the operations of $t_5$ to enable the voltage sources of the first group 315-c (e.g., maintaining a same fourth delay duration between $t_5$ and $t_7$). In another example, if a power-up command or other indication is issued between $t_1$ and $t_2$ (e.g., where voltage sources associated with the voltage $V_6$ and the second group 315-d are enabled), the memory die 200 may proceed directly with the operations of $t_5$ to enable the voltage sources of the first group 315-c. By aborting aspects of a power-down operation, latency may be reduced relative to cases where a power-down operation continues to completion despite an intervening indication of a power-up condition.

Figure 5:
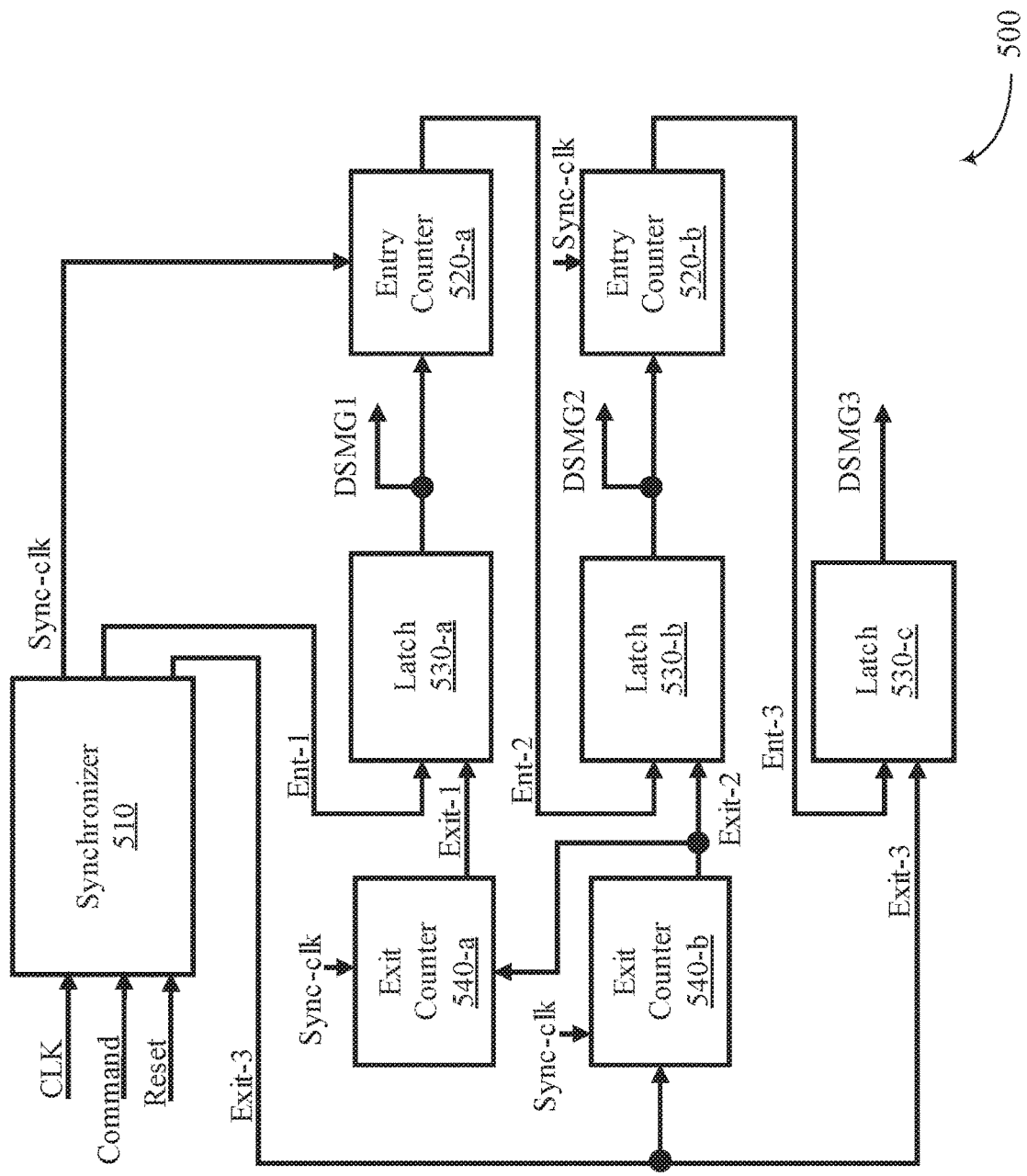
FIG. 5 illustrates an example of a timing chain that supports sequential voltage control for a memory device in accordance with examples as disclosed herein.

FIG. 5 illustrates an example of a timing chain 500 that supports sequential voltage control for a memory device in accordance with examples as disclosed herein. The timing chain 500 may be included in a memory die 200, or a memory device 110 that includes one or more memory dies 200, and may illustrate an example of components that support sequential disabling and enabling of three voltage sources or voltage source groups, such as the voltage sources described with reference to the timing diagram 400 of FIG. 4.

The timing chain 500 includes a synchronizer 510, which may be configured to receive signals, commands, or other indications or triggers related to power-down or power-up operations. For example, the synchronizer 510 may be configured to receive a command (e.g., as an 'enable' or 'disable' state of a power down command, a power-down command or a power-up command, an enter power-down or exit power-down command, an enter power-up or exit power up command, an idle command, a sleep command, a deep sleep command, a power command, a recovery command), which may include or be otherwise based on a command signal received from a host device 105 (e.g., over a CA channel), or may include or be otherwise based on a command issued by a memory device 110 (e.g., from a device memory controller 155). Additionally or alternatively, the synchronizer 510 may be configured to receive a Reset signal or indication (e.g., a power reset indication, via a memory die reset indication), which may include the synchronizer 510 being coupled with a reset pin or other pin of a memory die 200 or memory device 110.

The synchronizer 510 may also include or be coupled with a clock signal generation component, which may be used to synchronize operations relative to receiving a power-down or power-up command or other indication. In some examples, the synchronizer 510 may receive a clock signal CLK, which may refer to a clock signal that is received from a host device 105 (e.g., a synchronous clock), or some other component of a system 100 external to the memory device 110, or may be a clock signal that is generated at a memory device 110 or memory die 200 and may be synchronous or asynchronous with a host device 105. In some examples, the signal CLK may refer to an internal clock signal generated by a component of a memory device 110 or memory die 200 (e.g., an internal clock that is asynchronous with a host device 105), which may be present or available even in the absence of a clock signal from a host device 105 (e.g., when a clock signal from a host device 105 is disabled as part of a power-down or idling operation).

In some examples, the synchronizer 510 may transition an output signal Ent-1 upon a transition (e.g., a rising edge, a falling edge) of the clock signal CLK. For example, after receiving an indication of a power-down condition (e.g., a power-down command, an enter power-down command, an idle command, a sleep command, a Reset indication or pin state), the synchronizer 510 may transition the output signal Ent-1 from a low state to a high state upon a subsequent rising edge of the CLK signal. In some examples, the synchronizer 510 may also include a clock generation component, or other synchronizing component, that provides a synchronized clock signal Sync-clk to other components of the timing chain 500. By performing various aspects of synchronization, the synchronizer 510 may avoid indeterminate or metastable states related to power-up and power-down conditions or operations, or other aspects or logic between asynchronous logic and synchronous logic, including such conditions that may arise when an external clock is disabled during power-down conditions.

The timing chain 500 includes three latches 530, each configured to provide a respective output signal for enabling or disabling a voltage source or group of voltage sources. Latch 530-a may output a signal DSMG1, where a transition to a low state of DSMG1 may correspond to initiating a disabling of a first set of one or more voltage sources (e.g., initiating the operations of $t_1$ of timing diagram 400), and a transition to a high state of DSMG1 may correspond to initiating an enabling of the first set of one or more voltage sources (e.g., initiating the operations of $t_5$ of timing diagram 400). Latch 530-b may output a signal DSMG2, where a transition to a low state of DSMG2 may correspond to initiating a disabling of a second set of one or more voltage sources (e.g., initiating the operations of $t_2$ of timing diagram 400), and a transition to a high state of DSMG2 may correspond to initiating an enabling of the second set of one or more voltage sources (e.g., initiating the operations of $t_7$ of timing diagram 400). Latch 530-c may output a signal DSMG3, where a transition to a low state of DSMG3 may correspond to initiating a disabling of a third set of one or more voltage sources (e.g., initiating the operations of $t_4$ of timing diagram 400), and a transition to a high state of DSMG3 may correspond to initiating an enabling of the third set of one or more voltage sources (e.g., initiating the operations of $t_6$ of timing diagram 400). In some examples, one or more of the latches 530 may be configured as a bi-stable latch, such as a set/reset latch (e.g., an SR latch), which may include various configurations or combinations of circuit gates (e.g., NOR gates, NAND gates, or others).

Set transitions of the latches 530 may be delayed relative to each other based at least in part on entry counters 520, which may refer to entry into a power-down mode or condition (e.g., a sleep mode, an idle mode). For example, as part of initiating a power-down, sleep, or idling operation, the activated signal Ent-1 may be received at a set node of the latch 530-a to activate the signal DSMG1. Entry counter 520-a may count clock signals (e.g., edges or periods of Sync-clk) upon the activation of the signal DSMG1, and activate an output signal (e.g., Ent-2) when a count of the entry counter 520-a satisfies a threshold (e.g., related to a first delay duration, such as a delay between $t_2$ and $t_1$ of timing diagram 400). The activated signal Ent-2 may be received at a set node of the latch 530-b to activate the signal DSMG2. Entry counter 520-b may count clock signals (e.g., Sync-clk) upon an activation of the signal DSMG2, and activate an output signal (e.g., Ent-3) when a count of the entry counter 520-b satisfies a threshold (e.g., related to a second delay duration, such as a delay between $t_2$ and $t_4$ of timing diagram 400). The activated signal Ent-3 may be received at a set node of the latch 530-c to activate the signal DSMG3.

Reset transitions of the latches 530 may be delayed relative to each other based at least in part on exit counters 540, which may refer to exit from a power-down mode or condition. For example, upon receiving an indication of a power-up condition (e.g., a power-up command, an exit power-down command, a recovery command, a Reset indication or pin state, which may be an opposite indication or pin state relative to an indication of a power-down condition), the synchronizer 510 may enable a high state of the output signal Exit-3 upon a subsequent rising edge of the CLK signal. The activated signal Exit-3 may be received at a reset node of the latch 530-c to deactivate the signal DSMG3 (e.g., if the signal DSMG3 was previously activated), or maintain a deactivated signal DSMG3. Further, the exit counter 540-b may count clock signals (e.g., edges or periods of Sync-clk) upon the activation of the signal Exit-3, and activate an output signal (e.g., Exit-2) when a count of the exit counter 540-b satisfies a threshold (e.g., related to a third delay duration, such as a delay between $t_6$ and $t_7$ of timing diagram 400). The activated signal Exit-2 may be received at a reset node of the latch 530-b to deactivate the signal DSMG2 (e.g., if the signal DSMG2 was previously activated), or maintain a deactivated signal DSMG2. Further, the exit counter 540-a may count clock signals (e.g., Sync-clk) upon the activation of the signal Exit-2, and activate an output signal (e.g., Exit-1) when a count of the exit counter 540-a satisfies a threshold (e.g., related to a fourth delay duration, such as a delay between $t_7$ and $t_6$ of timing diagram 400). The activated signal Exit-1 may be received at a reset node of the latch 530-a to deactivate the signal DSMG1.

As a result of the configuration of exit counters 540, the timing chain 500 illustrates an example where a duration to complete power-up operations, relative to a power-up command or indication, may be constant (e.g., independent of respective states of the latches 530). However, in other timing chain configurations, respective states of the latches 530 may be considered, which may support shortening a duration to complete power-up operations (e.g., proceeding directly to a disabling of DSMG2 in the event that power-down operations were not completed, such as when DSMG3 remained disabled).

Figure 6:
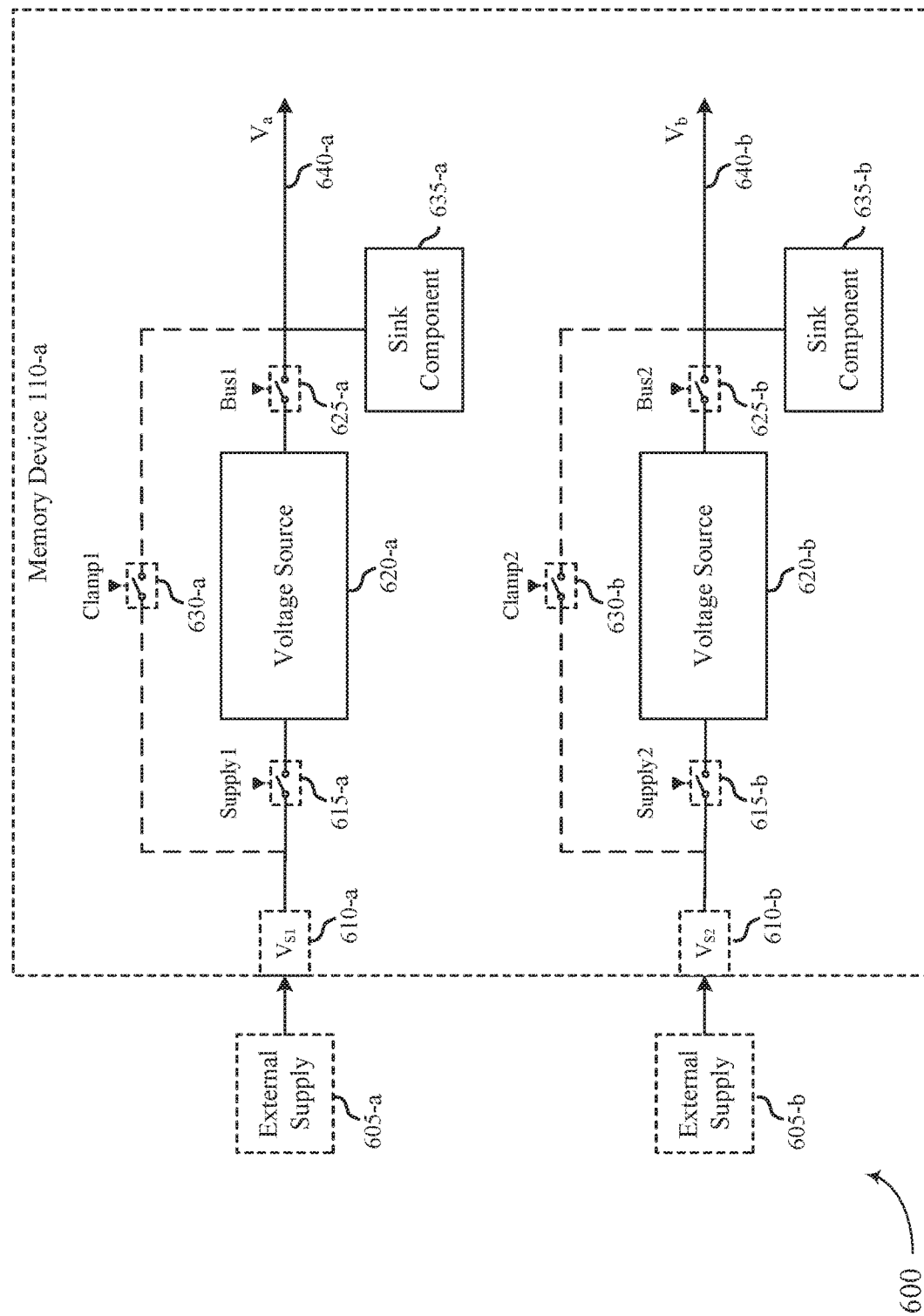
FIG. 6 illustrates an example of a voltage source layout that supports sequential voltage control for a memory device in accordance with examples as disclosed herein.

FIG. 6 illustrates an example of a voltage source layout 600 that supports sequential voltage control for a memory device in accordance with examples as disclosed herein. The voltage source layout 600 illustrates a simplified example of components and circuitry that may support sequential enabling and disabling of voltage sources 620 in a memory device 110-a. The example of voltage source layout 600 illustrates the memory device 110-a having two voltage sources 620, but a memory device 110-a, or components thereof (e.g., memory dies 160 of the memory device 110-a), may include any quantity of voltage sources 620 in accordance with the described techniques.

Each of the voltage sources 620 may include various circuitry for providing a regulated voltage (e.g., a power supply at a regulated voltage) to components of the memory device 110-a to support various operations of the memory device 110-a. For example, a voltage source 620 may include components (e.g., voltage boost components, voltage divider components, voltage regulation components) that output a voltage that is higher than or lower than an input voltage (e.g., from an external supply 605). A voltage source 620 may include amplification circuitry, filtering circuitry, or feedback circuitry, or various combinations thereof to provide a regulated voltage level under various load conditions.

In some examples, when enabled, each of the voltage sources 620 may provide a respective regulated voltage to a respective voltage source bus 640 (e.g., voltage source 620-a providing regulated voltage to voltage source bus 640-a, voltage source 620-b providing regulated voltage $V_b$ to voltage source bus 640-b). Each voltage source bus 640 may be coupled with various components of the memory device 110-a to support different aspects of operating the memory device 110-a. In some examples, a first set of one or more voltage source buses 640 may be coupled with semiconductor wells of the memory device 110-a (e.g., an n-wells), and a second set of one or more voltage source buses 640 may be coupled with semiconductor junctions of the memory device 110-a (e.g., p+ junctions).

To support a regulated voltage, each of the voltage sources 620 may be coupled with an external supply 605 (e.g., located outside of the memory device 110-a) via an external voltage supply node 610 of the memory device 110-a. In some examples (not shown), multiple voltage sources 620 may be coupled with a same external supply 605 (e.g., via a same external voltage supply node 610), and provide different regulated voltages to different voltage source buses 640. Multiple voltage sources 620 coupled with a same external supply 605 may be or may not be included in a same group 315, and an external voltage supply node 610 may be associated with one or more groups 315. For example, three voltage sources 620 coupled with the external voltage supply node 610-a (e.g., associated with a supply voltage $V_{S1}$) may be associated with the voltages $V_1$, $V_2$, and $V_3$, respectively, and three voltage sources 620 coupled with the external voltage supply node 610-b (e.g., associated with a supply voltage $V_{S2}$) may be associated with the voltages $V_4$, $V_5$, and $V_6$ respectively, as described with reference to FIGS. 3 through 5.

Each of the voltage sources 620 may be associated with a respective sink component 635 (e.g., a bleed circuit), which may provide a coupling with a ground component of the memory device 110-a or some other component, such as a resistive coupling that permits a discharge of a coupled voltage source bus 640. Each of the sink components 635 may be configured to support a respective charge or discharge characteristic (e.g., slew rate) of a respective voltage source bus 640 or coupled components during a selective enabling or disabling of a corresponding voltage source 620.

Each of the voltage sources 620 may be associated with respective circuitry that supports various techniques for enabling or disabling the respective voltage source 620, such as initiating an enabling or disabling the voltage source 620-a at a different time than initiating an enabling or disabling of the voltage source 620-b (e.g., sequential enabling, sequential disabling). In some examples, a voltage source 620 may be associated with a supply switch 615, operable to selectively couple or decouple the voltage source 620 from an external supply 605 or external voltage supply node 610. A respective logic signal (e.g., Supply1, Supply2) may be activated to enable a voltage source 620 by closing a connection via a supply switch 615, and deactivated to disable a voltage source 620 by opening a connection via the supply switch 615. In some examples, voltage sources 620 of a common group 315 may share a common supply switch 615, or may be configured to receive a common control signal (e.g., Supply1 being provided to each of a set of supply switches 615 of a group 315 associated with the external voltage supply node 610-a).

Additionally or alternatively, a voltage source 620 may be associated with a bus switch 625, operable to selectively couple or decouple the voltage source 620 from a voltage source bus 640. A respective logic signal (e.g., Bus1, Bus2) may be activated to enable a voltage source 620 by closing a connection via a bus switch 625, and deactivated to disable a voltage source 620 by opening a connection via the bus switch 625. In some examples, voltage sources 620 of a common group 315 be configured to receive a common control signal (e.g., Bus1 being provided to each of a set of bus switches 625 of a group 315 associated with the external voltage supply node 610-a).

Additionally or alternatively, a voltage source 620 may include circuitry otherwise configured to perform a voltage pull-down operation, where an output of the voltage source 620 is reduced in voltage, or circuitry configured to otherwise perform a voltage pull-up operation, where an output of the voltage source 620 is increased in voltage. The initiation of these and other examples of selective enabling or disabling (e.g., activation or deactivation of logic signals such as Supply1, Supply 2, Bus 1, or Bus 2) may be based at least in part on a timing chain, such as signals DSMG1, DSMG2, or DSMG3 described with reference to FIG. 5.

In some examples, a voltage source 620 may be associated with clamping circuitry that supports clamping a voltage source bus 640 to a respective clamp voltage (e.g., as described with reference to the operations of $t_3$ and $t_5$ of timing diagram 400 of FIG. 4). Clamping circuitry may be used to avoid a voltage source bus 640 being in a floating condition, but may be omitted in some examples. In the example of voltage source layout 600, the voltage source 620-a may include a clamp switch 630-a, configured to selectively couple or decouple the voltage source bus 640-a with the external voltage supply node 610-a, and the voltage source 620-*b* may include a clamp switch 630-*b*, configured to selectively couple or decouple the voltage source bus 640-*b* with the external voltage supply node 610-*b*. In various examples, voltage sources 620 of a common group 315 may be configured to receive a common control signal (e.g., Clamp1 being provided to each of a set of clamp switches 630 of a group 315 associated with the external voltage supply node 610-*a*). Although the clamping circuitry of voltage source layout 600 is illustrated as supporting a clamping with a same external voltage supply node 610 as is used to feed a given voltage source 620, clamping may be supported by a coupling with a different external voltage supply node 610, or some other voltage source or ground node of the memory device 110-*a*.

The components of the voltage source layout 600 may be variously distributed among subcomponents of the memory device 110-*a*. In some examples, the memory device 110-*a* (e.g., a device memory controller 155) may include the illustrated components, such that each of the voltage source buses 640 are coupled with the one or more memory dies 160 of the memory device 110-*a* (e.g., in a device-level voltage regulation architecture). In some examples, each memory die 160 of the memory device 110-*a* (e.g., each local memory controller 165) may include the illustrated components, such that each of the memory dies 160 include external voltage supply nodes 610 that are coupled, directly or indirectly, with external supplies 605 (e.g., in a die-level voltage regulation architecture). In some examples, a memory device 110-*a* may include a combination of device-level and die-level regulation, and may accordingly coordinate (e.g., at a device memory controller 155) the sequential enabling or disabling of device-level and die-level voltage sources 620. Device-level voltage sources 620 and die-level voltage sources 620 may be variously configured for enabling and disabling, such as device-level voltage sources 620 being associated with bus switches 625 (e.g., located outside memory dies 160) and die-level voltage sources 620 being associated with supply switches 615 (e.g., located outside memory dies 160, located within memory dies 160).

Figure 7:
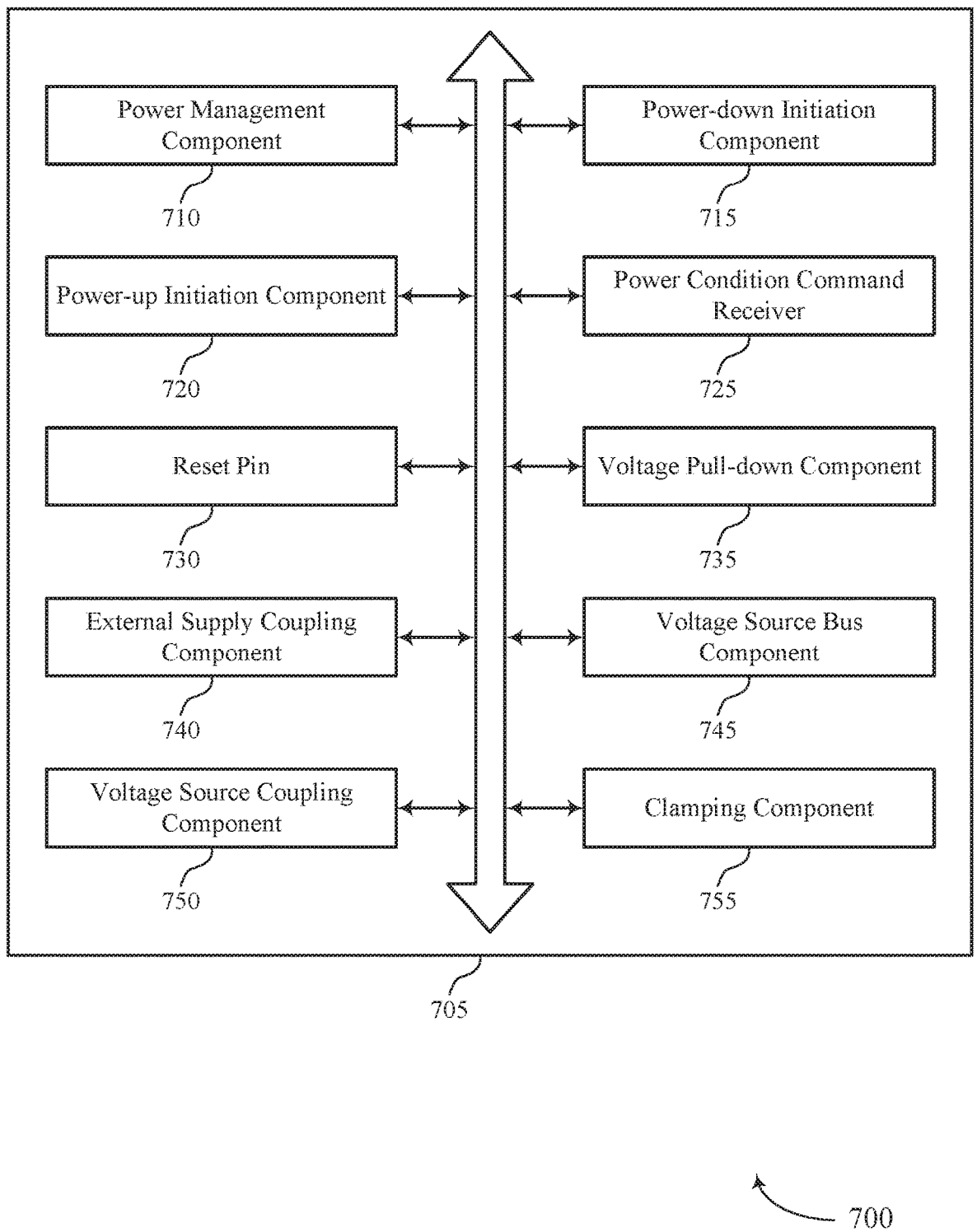
FIG. 7 shows a block diagram of a memory device that supports sequential voltage control for a memory device in accordance with examples as disclosed herein.

FIG. 7 shows a block diagram 700 of a memory device 705 that supports sequential voltage control for a memory device in accordance with examples as disclosed herein. The memory device 705 may be an example of aspects of a memory device as described with reference to FIGS. 1 through 6. The memory device 705 may include a power management component 710, a power-down initiation component 715, a power-up initiation component 720, a power condition command receiver 725, a reset pin 730, a voltage pull-down component 735, an external supply coupling component 740, a voltage source bus component 745, a voltage source coupling component 750, and a clamping component 755. Each of these modules may communicate, directly or indirectly, with one another (e.g., via one or more buses).

In various examples, the power management component 710 may identify a power-down condition for the memory device 705, or identify a power-up condition for the memory device 705.

The power-down initiation component 715 may perform a power-down operation based on the power management component 710 identifying a power-down condition. In some examples, performing the power-down operation may include disabling a first voltage source of the memory device 705, the first voltage source associated with a first voltage, and disabling a second voltage source of the memory device 705 after disabling the first voltage source, the second voltage source associated with a second voltage that is greater than the first voltage In some examples, the power-down initiation component 715 may generate various timing signals associated with initiating a disabling of one or more voltage sources. For example, the power-down initiation component 715 may generate a first timing signal based on identifying the power-down condition, where disabling the first voltage source is based on the first timing signal, and the power-down initiation component 715 may generate a second timing signal having a delay relative to the first timing signal, where disabling the second voltage source is based on the second timing signal.

The power-up initiation component 720 may perform a power-up operation based on the power management component 710 identifying a power-up condition. In some examples, performing the power-up operation may include enabling the second voltage source of the memory device 705, and enabling the first voltage source of the memory device 705 after enabling the second voltage source.

In some examples, the power condition command receiver 725 may receive an enter power-down command from a host device. A power-down condition may include a power-down mode for the memory device 705, and the power management component 710 may identify the power-down condition based on the enter power-down command. In some examples, the power condition command receiver 725 may receive an exit power-down command from the host device. A power-up operation may include exiting the power-down mode, and the power management component 710 may identify the power-up condition based on the exit power-down command.

In some examples, a power-down condition includes a power-down mode for the memory device 705, and the power management component 710 may identify the power-down condition or the power-down modes based on the activation of the reset pin 730. In some examples, a power-up operation includes exiting the power-down mode for the memory device 705, and the power management component 710 may identify the power-up condition or initiate exiting the power-down mode based on the deactivation of the reset pin 730.

The voltage pull-down component 735 may include or refer to one or more components configured to pull down or otherwise reduce an output of one or more voltage sources of the memory device 705 (e.g., a pull-down from a nominal or operational voltage for supporting one or more access operations of the memory device 705). In some examples, disabling a first voltage source includes the voltage pull-down component 735 initiating a voltage pull-down of the first voltage source from a first voltage, and disabling a second voltage source includes the voltage pull-down component 735 initiating a voltage pull-down of the second voltage source from a second voltage after initiating the voltage pull-down of the first voltage source.

The external supply coupling component 740 may include or refer to one or more switching components configured to selectively couple components of the memory device 705 with one or more external supply pins or nodes of the memory device 705. In some examples, disabling a first voltage source includes the external supply coupling component 740 decoupling a first external voltage supply node of the memory device 705 from an input node of the first voltage source, and disabling a second voltage source includes the external supply coupling component 740 decoupling a second external voltage supply node of the memory device 705 from an input node of the second voltage source after decoupling the first voltage source from the first external voltage supply node.

The voltage source bus component 745 may include or refer to one or more switching components configured to selectively couple one or more voltage sources of the memory device 705 with various buses or distribution paths corresponding to respective voltage sources. In some examples, disabling a first voltage source may include the voltage source bus component 745 decoupling an output node of the first voltage source from a first voltage source bus. In some examples, disabling a second voltage source may include the voltage source bus component 745 decoupling an output node of the second voltage source from a second voltage source bus after decoupling the output node of the first voltage source from the first voltage source bus.

The voltage source coupling component 750 may include one or refer to more switching components configured to selectively couple one or more voltage sources of the memory device 705 with various semiconductor wells or junctions of the memory device 705. In some examples, disabling a first voltage source may include the voltage source coupling component 750 decoupling, from the first voltage source, a p-junction coupled with an n-well of the memory device 705. In some examples, disabling a second voltage source may include the voltage source coupling component 750 decoupling the n-well from the second voltage source after decoupling the p-junction from the first voltage source.

The clamping component 755 may couple a voltage source bus associated with the first voltage source with an external voltage supply node of the memory device 705 after disabling the first voltage source, the external voltage supply node associated with a third voltage that is less than the first voltage.

Figure 8:
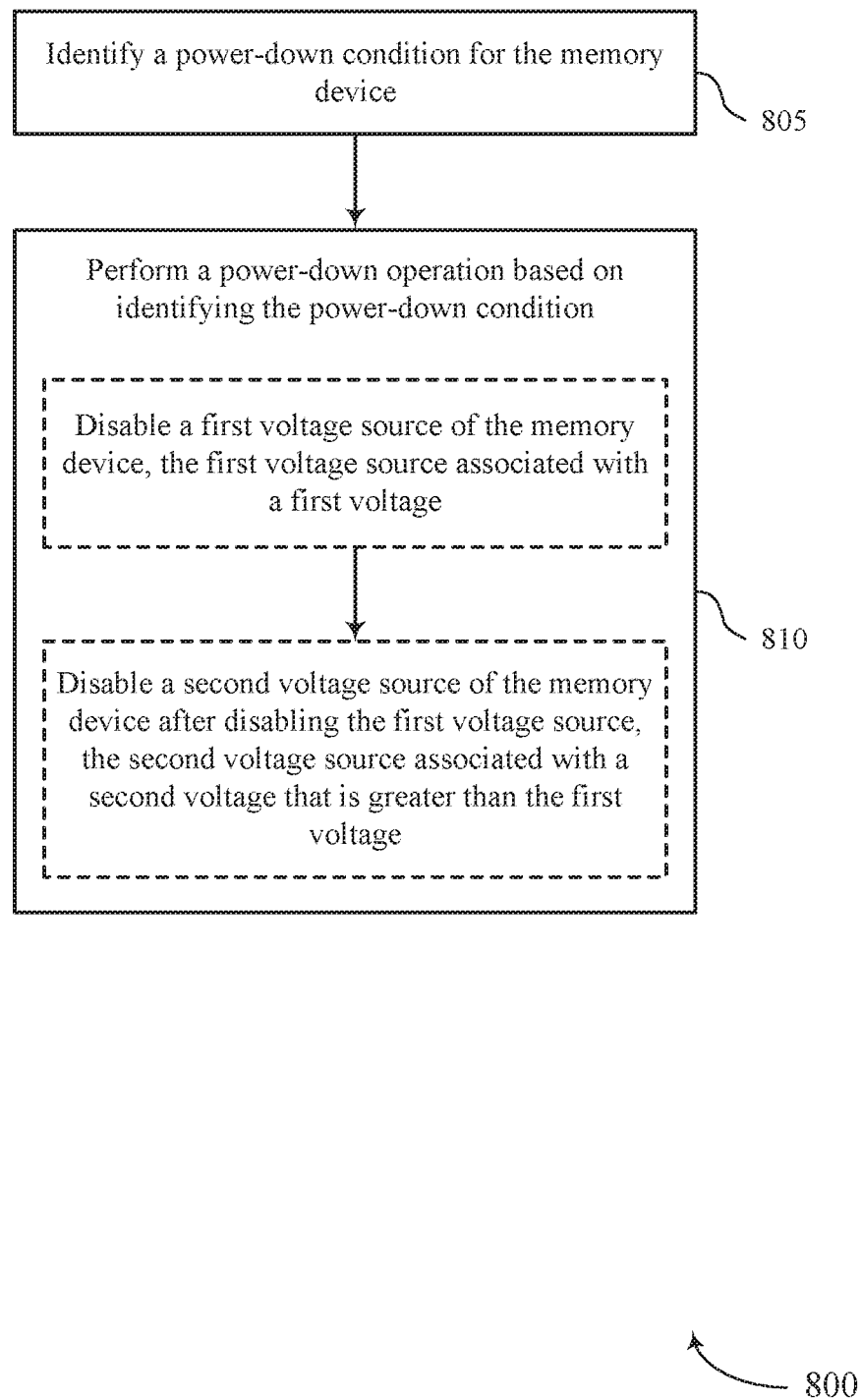
FIG. 8 shows a flowchart illustrating a method or methods that support sequential voltage control for a memory device in accordance with examples as disclosed herein.

FIG. 8 shows a flowchart illustrating a method or methods 800 that supports sequential voltage control for a memory device in accordance with examples as disclosed herein. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may identify a power-down condition for the memory device. The operations of 805 may be performed according to the methods described herein. In some examples, aspects of the operations of 805 may be performed by a power management component as described with reference to FIG. 7.

At 810, the memory device may perform a power-down operation based on identifying the power-down condition. The power-down operation may include disabling a first voltage source of the memory device, the first voltage source associated with a first voltage, and disabling a second voltage source of the memory device after disabling the first voltage source, the second voltage source associated with a second voltage that is greater than the first voltage. The operations of 810 may be performed according to the methods described herein. In some examples, aspects of the operations of 810 may be performed by a power-down initiation component as described with reference to FIG. 7.

In some examples, an apparatus as described herein may perform a method or methods, such as the method 800. The apparatus may include features, circuitry, means, or instructions (e.g., a non-transitory computer-readable medium storing instructions executable by a processor) for identifying a power-down condition for the memory device and performing a power-down operation based on identifying the power-down condition. In some examples, performing the power-down operation may include disabling a first voltage source of the memory device, the first voltage source associated with a first voltage, and disabling a second voltage source of the memory device after disabling the first voltage source, the second voltage source associated with a second voltage that is greater than the first voltage.

Some examples of the method 800 and the apparatus described herein may further include operations, features, circuitry, means, or instructions for identifying a power-up condition for the memory device, and performing a power-up operation based on identifying the power-up condition. In some examples, performing the power-up operation may include enabling the second voltage source of the memory device, and enabling the first voltage source of the memory device after enabling the second voltage source.

Some examples of the method 800 and the apparatus described herein may further include operations, features, circuitry, means, or instructions for receiving an enter power-down command from a host device, where the power-down condition includes a power-down mode for the memory device, and where identifying the power-down condition may be based on the enter power-down command. Some examples of the method 800 and the apparatus described herein may further include operations, features, circuitry, means, or instructions for receiving an exit power-down command from the host device, where the power-up operation includes exiting the power-down mode, and where identifying the power-up condition may be based on the exit power-down command.

Some examples of the method 800 and the apparatus described herein may further include operations, features, circuitry, means, or instructions for identifying an activation of a reset pin of the memory device, where the power-down condition includes a power-down mode for the memory device, and where identifying the power-down condition may be based on the activation of the reset pin. Some examples of the method 800 and the apparatus described herein may further include operations, features, circuitry, means, or instructions for identifying a deactivation of the reset pin, where the power-up operation includes exiting the power-down mode for the memory device, and where identifying the power-up condition may be based on the deactivation of the reset pin.

In some examples of the method 800 and the apparatus described herein, disabling the first voltage source may include operations, features, circuitry, means, or instructions for initiating a voltage pull-down of the first voltage source from the first voltage. In some examples of the method 800 and the apparatus described herein, disabling the second voltage source may include operations, features, circuitry, means, or instructions for initiating a voltage pull-down of the second voltage source from the second voltage after initiating the voltage pull-down of the first voltage source.

In some examples of the method 800 and the apparatus described herein, disabling the first voltage source may include operations, features, circuitry, means, or instructions for decoupling a first external voltage supply node of the memory device from an input node of the first voltage source. In some examples of the method 800 and the apparatus described herein, disabling the second voltage source may include operations, features, circuitry, means, or instructions for decoupling a second external voltage supply node of the memory device from an input node of the second voltage source after decoupling the first voltage source from the first external voltage supply node.

In some examples of the method 800 and the apparatus described herein, disabling the first voltage source may include operations, features, circuitry, means, or instructions for decoupling an output node of the first voltage source from a first voltage source bus. In some examples of the method 800 and the apparatus described herein, disabling the second voltage source may include operations, features, circuitry, means, or instructions for decoupling an output node of the second voltage source from a second voltage source bus after decoupling the output node of the first voltage source from the first voltage source bus.

In some examples of the method 800 and the apparatus described herein, disabling the first voltage source may include operations, features, circuitry, means, or instructions for decoupling, from the first voltage source, a p-junction coupled with an n-well of the memory device. In some examples of the method 800 and the apparatus described herein, disabling the second voltage source may include operations, features, circuitry, means, or instructions for decoupling the n-well from the second voltage source after decoupling the p-junction from the first voltage source.

Some examples of the method 800 and the apparatus described herein may further include operations, features, circuitry, means, or instructions for coupling a voltage source bus associated with the first voltage source with an external voltage supply node of the memory device after disabling the first voltage source, the external voltage supply node associated with a third voltage that may be less than the first voltage.

Some examples of the method 800 and the apparatus described herein may further include operations, features, circuitry, means, or instructions for generating a first timing signal based on identifying the power-down condition, where disabling the first voltage source may be based on the first timing signal, and generating a second timing signal having a delay relative to the first timing signal, where disabling the second voltage source may be based on the second timing signal.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory die including a first voltage source for operating the set of memory cells, the first voltage source associated with a first voltage, and a second voltage source for operating the set of memory cells, the second voltage source associated with a second voltage that is greater than the first voltage. The memory die may also include circuitry operable to identify a power-down condition for the memory die, disable the first voltage source based on identifying the power-down condition, and disable the second voltage source based on identifying the power-down condition and with a delay relative to disabling the first voltage source.

In some examples of the apparatus, the circuitry may be operable to identify a power-up condition for the memory die, enable the second voltage source based on identifying the power-up condition, and enable the first voltage source based on identifying the power-up condition and with a delay relative to enabling the second voltage source.

In some examples of the apparatus, to disable the first voltage source, the circuitry may be operable to initiate a voltage pull-down of the first voltage source from the first voltage, and, to disable the second voltage source, the circuitry may be operable to initiate a voltage pull-down of the second voltage source from the second voltage after initiating the voltage pull-down of the first voltage source.

In some examples of the apparatus, to disable the first voltage source, the circuitry may be operable to decouple a first external voltage supply node of the memory die from an input node of the first voltage source, and, to disable the second voltage source, the circuitry may be operable to decouple a second external voltage supply node of the memory die from an input node of the second voltage source after decoupling the first voltage source from the first external voltage supply node.

In some examples of the apparatus, to disable the first voltage source, the circuitry may be operable to decouple an output node of the first voltage source from a first voltage source bus, and, to disable the second voltage source, the circuitry may be operable to decouple an output node of the second voltage source from a second voltage source bus after decoupling the output node of the first voltage source from the first voltage source bus.

Some examples of the apparatus may include a p-junction coupled with an n-well of the memory die. In some examples, to disable the first voltage source, the circuitry may be operable to decouple the p-junction from the first voltage source, and, to disable the second voltage source, the circuitry may be operable to decouple the n-well from the second voltage source after decoupling the p-junction from the first voltage source.

In some examples of the apparatus, the circuitry may be operable to couple a voltage source bus associated with the first voltage source with an external voltage supply node of the memory die after disabling the first voltage source, the external voltage supply node associated with a third voltage that may be less than the first voltage.

In some examples of the apparatus, the circuitry may be operable to receive an enter power-down command from a host device. A power-down condition may include a power-down mode for the memory device, and identifying the power-down condition or power-down mode may be based on receiving the power-down command.

In some examples of the apparatus, the circuitry may be operable to identify an activation of a reset pin of the memory device. A power-down condition may include a power-down mode for the memory device, and identifying the power-down condition or power-down mode for the memory device may be based on identifying the activation of the reset pin.

In some examples of the apparatus, the circuitry may be operable to generate a first timing signal based on identifying the power-down condition, disable the first voltage source based on the first timing signal, generate a second timing signal having a delay relative to the first timing signal, and disable the second voltage source based on the second timing signal.

An apparatus is described. The apparatus may include a first voltage source of a memory device for accessing a set of memory cells, the first voltage source associated with a first voltage, and a second voltage source of the memory device for accessing the set of memory cells, the second voltage source associated with a second voltage that is greater than the first voltage. The apparatus may include circuitry of the memory device that is operable to generate a first timing signal based on receiving the indication of the power-down condition, disable the first voltage source based on the first timing signal, generate a second timing signal having a delay relative to the first timing signal, and disable the second voltage source based on the second timing signal.

In some examples of the apparatus, the circuitry may be operable to receive an indication of a power-up condition of the memory device, generate a third timing signal based on receiving the indication of the power-up condition, enable the second voltage source based on the third timing signal, generate a fourth timing signal having a second delay relative to the third timing signal, and enable the first voltage source based on the fourth timing signal.

In some examples of the apparatus, the circuitry may be operable to generate a synchronized clock signal based on receiving the indication of the power-down condition, generate the first timing signal based on the synchronized clock signal, and generate the second timing signal having the delay relative to the first timing signal based on the synchronized clock signal and a first counter.

In some examples of the apparatus, the circuitry may be operable to receive an indication of a power-up condition of the memory device, generate a third timing signal based on receiving the indication of the power-up condition and the synchronized clock signal, enable the second voltage source based on the third timing signal, generate a fourth timing signal having a second delay, relative to the third timing signal, that is based on the synchronized clock signal and a second counter, and enable the first voltage source based on the fourth timing signal.

In some examples of the apparatus, the circuitry may be operable to latch the first timing signal using a first latch component, and latch the second timing signal using a second latch component.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   identifying, at a memory device, a power-down condition for the memory device; and
   performing a power-down operation based at least in part on identifying the power-down condition, wherein performing the power-down operation comprises:
      generating a synchronized clock signal based at least in part on identifying the power-down condition;
      generating a first timing signal based at least in part on the synchronized clock signal;
      disabling a first voltage source of the memory device based at least in part on the first timing signal, the first voltage source associated with a first voltage;
      generating a second timing signal having a delay relative to the first timing signal based at least in part on the synchronized clock signal and a first counter; and
      disabling a second voltage source of the memory device based at least in part on the second timing signal having the delay relative to the first timing signal, the second voltage source associated with a second voltage that is greater than the first voltage.

2. The method of claim 1, further comprising:
   identifying, at the memory device, a power-up condition for the memory device; and
   performing a power-up operation based at least in part on identifying the power-up condition, wherein performing the power-up operation comprises:
      enabling the second voltage source of the memory device; and
      enabling the first voltage source of the memory device after enabling the second voltage source.

3. The method of claim 2, further comprising:
   receiving an enter power-down command from a host device, wherein the power-down condition comprises a power-down mode for the memory device, and wherein identifying the power-down condition is based at least in part on the enter power-down command; and
   receiving an exit power-down command from the host device, wherein the power-up operation comprises exiting the power-down mode, and wherein identifying the power-up condition is based at least in part on the exit power-down command.

4. The method of claim 2, further comprising:
   identifying an activation of a reset pin of the memory device, wherein the power-down condition comprises a power-down mode for the memory device, and wherein identifying the power-down condition is based at least in part on the activation of the reset pin; and
   identifying a deactivation of the reset pin, wherein the power-up operation comprises exiting the power-down mode for the memory device, and wherein identifying the power-up condition is based at least in part on the deactivation of the reset pin.

5. The method of claim 1, wherein:
disabling the first voltage source comprises initiating a voltage pull-down of the first voltage source from the first voltage; and
disabling the second voltage source comprises initiating a voltage pull-down of the second voltage source from the second voltage after initiating the voltage pull-down of the first voltage source.

6. A method, comprising:
identifying, at a memory device, a power-down condition for the memory device; and
performing a power-down operation based at least in part on identifying the power-down condition, wherein performing the power-down operation comprises:
 disabling a first voltage source of the memory device, the first voltage source associated with a first voltage, wherein disabling the first voltage source comprises decoupling a first external voltage supply node of the memory device from an input node of the first voltage source; and
 disabling a second voltage source of the memory device after disabling the first voltage source, the second voltage source associated with a second voltage that is greater than the first voltage, wherein disabling the second voltage source comprises decoupling a second external voltage supply node of the memory device from an input node of the second voltage source after decoupling the first voltage source from the first external voltage supply node.

7. A method, comprising:
identifying, at a memory device, a power-down condition for the memory device; and
performing a power-down operation based at least in part on identifying the power-down condition, wherein performing the power-down operation comprises:
 disabling a first voltage source of the memory device, the first voltage source associated with a first voltage, wherein disabling the first voltage source comprises decoupling an output node of the first voltage source from a first voltage source bus; and
 disabling a second voltage source of the memory device after disabling the first voltage source, the second voltage source associated with a second voltage that is greater than the first voltage, wherein disabling the second voltage source comprises decoupling an output node of the second voltage source from a second voltage source bus after decoupling the output node of the first voltage source from the first voltage source bus.

8. A method, comprising:
identifying, at a memory device, a power-down condition for the memory device; and
performing a power-down operation based at least in part on identifying the power-down condition, wherein performing the power-down operation comprises:
 disabling a first voltage source of the memory device, the first voltage source associated with a first voltage, wherein disabling the first voltage source comprises decoupling, from the first voltage source, a p-junction coupled with an n-well of the memory device; and
 disabling a second voltage source of the memory device after disabling the first voltage source, the second voltage source associated with a second voltage that is greater than the first voltage, wherein disabling the second voltage source comprises decoupling the n-well from the second voltage source after decoupling the p-junction from the first voltage source.

9. A method, comprising:
identifying, at a memory device, a power-down condition for the memory device; and
performing a power-down operation based at least in part on identifying the power-down condition, wherein performing the power-down operation comprises:
 disabling a first voltage source of the memory device, the first voltage source associated with a first voltage;
 disabling a second voltage source of the memory device after disabling the first voltage source, the second voltage source associated with a second voltage that is greater than the first voltage; and
 coupling a voltage source bus associated with the first voltage source with an external voltage supply node of the memory device after disabling the first voltage source, the external voltage supply node associated with a third voltage that is less than the first voltage.

10. An apparatus, comprising:
a memory die comprising:
 a plurality of memory cells;
 a first voltage source for operating the plurality of memory cells, the first voltage source associated with a first voltage;
 a second voltage source for operating the plurality of memory cells, the second voltage source associated with a second voltage that is greater than the first voltage; and
 circuitry operable to:
  identify a power-down condition for the memory die;
  disable the first voltage source based at least in part on identifying the power-down condition, wherein, to disable the first voltage source, the circuitry is operable to decouple a first external voltage supply node of the memory die from an input node of the first voltage source; and
  disable the second voltage source based at least in part on identifying the power-down condition and with a delay relative to disabling the first voltage source, wherein, to disable the second voltage source, the circuitry is operable to decouple a second external voltage supply node of the memory die from an input node of the second voltage source after decoupling the first voltage source from the first external voltage supply node.

11. The apparatus of claim 10, wherein the circuitry is operable to:
identify a power-up condition for the memory die;
enable the second voltage source based at least in part on identifying the power-up condition; and
enable the first voltage source based at least in part on identifying the power-up condition and with a delay relative to enabling the second voltage source.

12. The apparatus of claim 10, wherein:
to disable the first voltage source, the circuitry is operable to initiate a voltage pull-down of the first voltage source from the first voltage; and
to disable the second voltage source, the circuitry is operable to initiate a voltage pull-down of the second voltage source from the second voltage after initiating the voltage pull-down of the first voltage source.

13. An apparatus, comprising:
a memory die comprising:
  a plurality of memory cells;
  a first voltage source for operating the plurality of memory cells, the first voltage source associated with a first voltage;
  a second voltage source for operating the plurality of memory cells, the second voltage source associated with a second voltage that is greater than the first voltage; and
  circuitry operable to:
    identify a power-down condition for the memory die;
    disable the first voltage source based at least in part on identifying the power-down condition, wherein, to disable the first voltage source, the circuitry is operable to decouple an output node of the first voltage source from a first voltage source bus; and
    disable the second voltage source based at least in part on identifying the power-down condition and with a delay relative to disabling the first voltage source, wherein, to disable the second voltage source, the circuitry is operable to decouple an output node of the second voltage source from a second voltage source bus after decoupling the output node of the first voltage source from the first voltage source bus.

14. An apparatus, comprising:
a memory die comprising:
  a plurality of memory cells;
  a first voltage source for operating the plurality of memory cells, the first voltage source associated with a first voltage;
  a second voltage source for operating the plurality of memory cells, the second voltage source associated with a second voltage that is greater than the first voltage;
  a p-junction coupled with an n-well of the memory die; and
  circuitry operable to:
    identify a power-down condition for the memory die;
    disable the first voltage source based at least in part on identifying the power-down condition, wherein, to disable the first voltage source, the circuitry is operable to decouple the p-junction from the first voltage source; and
    disable the second voltage source based at least in part on identifying the power-down condition and with a delay relative to disabling the first voltage source, wherein, to disable the second voltage source, the circuitry is operable to decouple the n-well from the second voltage source after decoupling the p-junction from the first voltage source.

15. An apparatus, comprising:
a memory die comprising:
  a plurality of memory cells;
  a first voltage source for operating the plurality of memory cells, the first voltage source associated with a first voltage;
  a second voltage source for operating the plurality of memory cells, the second voltage source associated with a second voltage that is greater than the first voltage; and
  circuitry operable to:
    identify a power-down condition for the memory die;
    disable the first voltage source based at least in part on identifying the power-down condition;
    disable the second voltage source based at least in part on identifying the power-down condition and with a delay relative to disabling the first voltage source; and
    couple a voltage source bus associated with the first voltage source with an external voltage supply node of the memory die after disabling the first voltage source, the external voltage supply node associated with a third voltage that is less than the first voltage.

16. The apparatus of claim 10, wherein the circuitry is operable to:
  receive an enter power-down command from a host device, wherein the power-down condition comprises a power-down mode for the memory die, and wherein identifying the power-down condition is based at least in part on the enter power-down command.

17. The apparatus of claim 10, wherein the circuitry is operable to:
  identify an activation of a reset pin of the memory die, wherein the power-down condition comprises a power-down mode for the memory die, and wherein identifying the power-down condition is based at least in part on the activation of the reset pin.

18. The apparatus of claim 10, wherein the circuitry is operable to:
  generate a first timing signal based at least in part on identifying the power-down condition;
  disable the first voltage source based at least in part on the first timing signal;
  generate a second timing signal having a delay relative to the first timing signal; and
  disable the second voltage source based at least in part on the second timing signal.

19. An apparatus, comprising:
a first voltage source of a memory device for accessing a plurality of memory cells, the first voltage source associated with a first voltage;
a second voltage source of the memory device for accessing the plurality of memory cells, the second voltage source associated with a second voltage that is greater than the first voltage; and
circuitry of the memory device operable to:
  receive an indication of a power-down condition of the memory device;
  generate a synchronized clock signal based at least in part on receiving the indication of the power-down condition;
  generate a first timing signal based at least in part on the synchronized clock signal;
  disable the first voltage source based at least in part on the first timing signal;
  generate a second timing signal having a delay relative to the first timing signal based at least in part on the synchronized clock signal and a first counter; and
  disable the second voltage source based at least in part on the second timing signal.

20. The apparatus of claim 19, wherein the circuitry of the memory device is operable to:
  receive an indication of a power-up condition of the memory device;
  generate a third timing signal based at least in part on receiving the indication of the power-up condition;
  enable the second voltage source based at least in part on the third timing signal;
  generate a fourth timing signal having a second delay relative to the third timing signal; and enable the first voltage source based at least in part on the fourth timing signal.

21. The apparatus of claim 19, wherein the circuitry of the memory device is operable to:
receive an indication of a power-up condition of the memory device;
generate a third timing signal based at least in part on receiving the indication of the power-up condition and the synchronized clock signal;
enable the second voltage source based at least in part on the third timing signal;
generate a fourth timing signal having a second delay, relative to the third timing signal, that is based at least in part on the synchronized clock signal and a second counter; and
enable the first voltage source based at least in part on the fourth timing signal.

22. An apparatus comprising:
a first voltage source of a memory device for accessing a plurality of memory cells, the first voltage source associated with a first voltage;
a second voltage source of the memory device for accessing the plurality of memory cells, the second voltage source associated with a second voltage that is greater than the first voltage; and
circuitry of the memory device operable to:
receive an indication of a power-down condition of the memory device;
generate a first timing signal based at least in part on receiving the indication of the power-down condition;
latch the first timing signal using a first latch component;
disable the first voltage source based at least in part on latching the first timing signal;
generate a second timing signal having a delay relative to the first timing signal;
latch the second timing signal using a second latch component; and
disable the second voltage source based at least in part on latching the second timing signal.

* * * * *